US006915495B2

(12) United States Patent
La Scala

(10) Patent No.: US 6,915,495 B2
(45) Date of Patent: Jul. 5, 2005

(54) PROCESS AND SYSTEM FOR MANAGEMENT OF TEST ACCESS PORT (TAP) FUNCTIONS

(75) Inventor: Amedeo La Scala, Palermo (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 115 days.

(21) Appl. No.: 10/061,949

(22) Filed: Jan. 31, 2002

(65) Prior Publication Data

US 2002/0120908 A1 Aug. 29, 2002

(30) Foreign Application Priority Data

Jan. 31, 2001 (EP) .......................................... 01830065

(51) Int. Cl.[7] .......................... G06F 17/50; G01R 31/28
(52) U.S. Cl. .......................................... 716/4; 714/727
(58) Field of Search .............................. 716/4; 714/727, 714/726

(56) References Cited

U.S. PATENT DOCUMENTS

| 5,054,024 A | * | 10/1991 | Whetsel | ..................... 714/726 |
|---|---|---|---|---|
| 5,519,713 A | | 5/1996 | Baeg et al. | ................. 371/22.1 |
| 5,570,375 A | * | 10/1996 | Tsai et al. | .................... 714/727 |
| 5,623,503 A | * | 4/1997 | Rutkowski | ................... 714/727 |
| 5,805,608 A | * | 9/1998 | Baeg et al. | ................. 714/726 |
| 5,812,562 A | * | 9/1998 | Baeg | .......................... 714/726 |
| 6,028,983 A | | 2/2000 | Jaber | ..................... 395/183.06 |
| 6,539,491 B1 | * | 3/2003 | Skergan et al. | ............. 713/500 |
| 6,560,734 B1 | * | 5/2003 | Whetsel | ...................... 714/724 |

OTHER PUBLICATIONS

Whetsel, L., "An IEEE 1149.1 Based Test Access Architecture For ICs with Embedded Cores," *International Test Conference*, New York, Nov. 1, 1997, pp. 69–78.

* cited by examiner

*Primary Examiner*—A. M. Thompson
(74) *Attorney, Agent, or Firm*—Lisa K. Jorgenson; E. Russell Tarleton; Seed IP Law Group PLLC

(57) ABSTRACT

Management of Test Access Port functions of a plurality of components arranged on a single chip by selectively driving the TAP function of each of the components with respective clocks, whilst the further signals for driving the TAP function are used in a shared mode among the various components. Preferably, associated with the aforesaid clocks is a pull-down function for selectively blanking the respective clocks in conditions of non-use. In a preferred way, the aforesaid dedicated clocks are generated on board the chip.

21 Claims, 1 Drawing Sheet

PROCESS AND SYSTEM FOR MANAGEMENT OF TEST ACCESS PORT (TAP) FUNCTIONS

BACKGROUND OF THE INVENTION

1. Field of the Invention

The present invention relates to management of Test Access Port (TAP) functions and has been developed with particular attention paid to the possible application to systems on a single chip (systems on a chip—SOCs), in particular in compliance with the JTAG/IEEE 1149.1 Standard.

2. Description of the Related Art

The test standard JTAG/IEEE 1149.1 has been developed and has met with considerable success as regards the need to overcome the problems that are likely to arise, for example, in surface-mounted packages, in boards with components mounted on both faces (the so-called "double-sided boards), in multichip modules and, in general, in situations in which problems of gaining access to given signals may arise.

In particular, the standard in question makes it possible to carry out testing on circuits which otherwise could not be tested, a fact that implies the possibility of cutting down considerably on times and costs for developing and commercializing a product.

The standard in question enables a TAP configuration to be obtained based upon an architecture currently known as boundary scan.

This solution is based upon the possibility of providing, in the context of an integrated circuit, circuit elements that are able to perform functions of testing, maintenance and support of the circuit, even after the latter has been mounted, for instance, on a board.

The circuitry in question usually comprises a standard interface through which the test instructions and data are communicated. A set of testing characteristics are defined, including a so-called "boundary-scan register", in such a way that the component may be able to respond to a minimum set of instructions defined so as to enable testing of the circuit.

In particular, the IEEE 1149.1 Standard defines the architecture of the TAP and of the corresponding circuits (which are essentially based upon a shift register) comprised in a device of the boundary-scan type. Each signal pin is connected to a cell of the shift register. The cells in question are connected in a path that may be likened to a shift register set along the periphery or boundary (hence, the term "boundary scan") of the device, so as to supply a virtual access to the signal pins. Using the virtual access provided by the boundary-scan architecture, it is possible to provide a testing function, even in the framework of rather complex circuits, in conditions where physical access is not feasible.

The main advantage of the boundary-scan technique lies in the possibility of observing data on the inputs of the device, as well as control data on the device outputs, all of which are obtained regardless of the logic of the system implemented on the chip.

In addition, the boundary-scan technique provides a better diagnostic function than those offered by traditional testing techniques. Usually, a testing function of a traditional type envisages application of given signal configurations to the input pins and then observation of the response given by the circuit on the output pins. If there is a defect present on one of the input pins, traditional testing techniques are able to detect the existence of this defect, but in general they call for a rather complex investigation to identify which of the input pins is the defective one. Instead, the cells of a boundary-scan scheme observe the response of the circuit by monitoring the input pins, so that a test carried out using the boundary-scan technique makes it possible to determine very easily, for example, which input pin is not making contact with the circuit. Furthermore, this can be achieved even without the need to make a physical contact with the pin in question.

At least in principle, by making a set based totally on components operating according to a boundary-scan scheme, the shift-register paths of all the devices may be connected together to form a single path. In this way, it is possible to check and monitor the behaviour of all the pins and of all the interconnections of the device simply from an edge connector.

Traditionally, in the case of a SOC system, the TAP function is used for two main purposes.

In the first place, it is used to handle all the signals and the control and testing functions according to the JTAG/IEEE 1149.1 Standard.

In the second place, it is used as external connection for the debugging system present on the chip.

In the case of SOC systems in which a number of chips are integrated, there may arise the problem deriving from the fact that the corresponding TAP functions, one for testing and the other for debugging, must be made to operate on the same chip, using the same JTAG interface and hence preventing proliferation of the corresponding pins.

BRIEF SUMMARY OF THE INVENTION

According to the disclosed embodiment of the present invention, a process and a system for management of a Test Access Port (TAP) are provided.

Basically, the solution according to the invention envisages that, in the context of the various components comprised on the same chip and provided with respective TAPs, each of the TAP functions will present a dedicated clock signal (TCK, DCK, . . . , NCK), whilst the other signals (TDI, TDO, TMS, NTRST) are shared.

The need to drive the corresponding input without infringing the IEEE Standard referred to above, and at the same time the need to use one TAP function for testing and the other for debugging without any mutual interference is preferably solved by adding a pull-down module to the various dedicated clock inputs TCK, DCK, etc., so as to eliminate the problem of driving the input. At least one further signal in a shared way between the TAP functions of the plurality of components; and selectively driving the TAP functions of the plurality of components with the respective clock signals.

In accordance with another embodiment of the invention, a system for management of a Test Access Port function in a plurality of components arranged on a single chip is provided. The system includes a TAP function associated with each component of the plurality of components; a respective clock signal associated with each component of the plurality of components and adapted to drive the respective TAP function; at least one shared line for use by at least one further signal between the TAP functions of the plurality of components; and at least one generator of each respective clock signal for selectively driving the respective TAP functions of the plurality of components.

BRIEF DESCRIPTION OF THE SEVERAL VIEWS OF THE DRAWINGS

The invention will now be described, purely by way of non-limiting example, with reference to the attached drawings, in which.

DETAILED DESCRIPTION OF THE INVENTION

Figure 1:
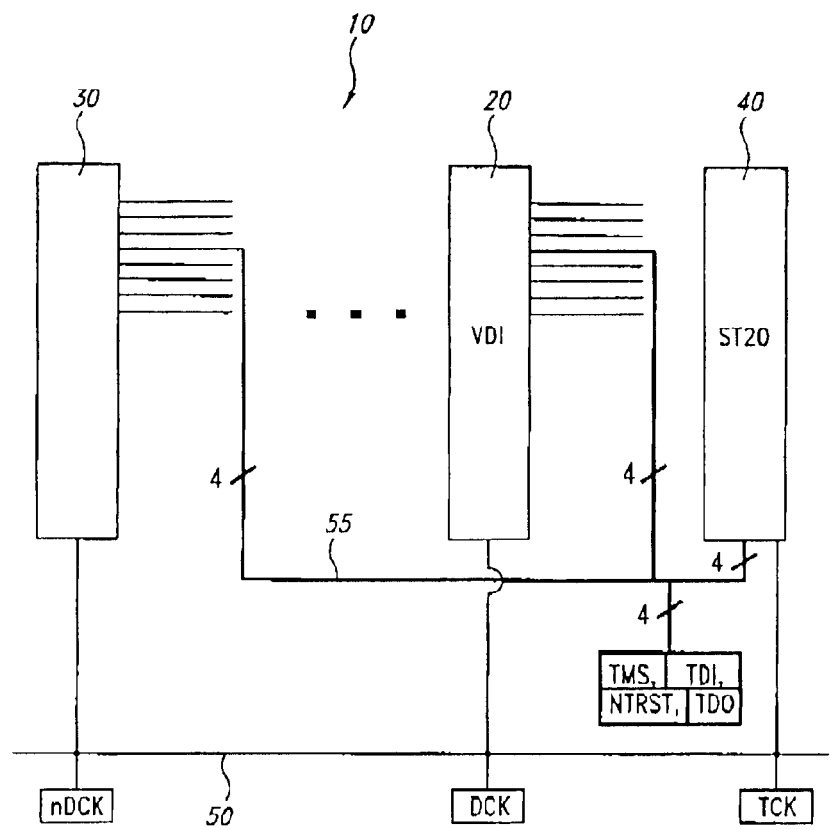
FIG. 1 illustrates, in the form of a block diagram, the architecture of a system operating according to an embodiment of the invention.

The block diagram of FIG. 1 is a general illustration of the organization of the TAP function (TAP controller) in a SOC system comprising in general a plurality of individual chips, each of which is in turn provided with a respective TAP function with respective debugging connections.

To clarify the concept (but without any limitation on the extent of the invention), one of the possible applications embodiment of the present invention envisages the association, within a single SOC system, designated as a whole by 10, of two chips consisting of the chip sold by the present Assignee of the applicant under the commercial name ST20 and of the chip sold by the company Hitachi under the commercial name SuperH40.

The respective TAP modules are designated by the reference numbers 20 and 30, these designations being limited to the debugging connections.

The reference number 40, instead, designates the set of JTAG pins.

It will moreover be appreciated that the solution according to the invention is of general application in a configuration comprising any number of chips.

Basically, the solution according to the invention envisages, for controlling operation of each TAP function, the use of a dedicated clock (TCK, DCK, ..., nDCK), whilst the other signals (TDI, TDO, TMI, NTRST) are shared.

In situations of the case illustrated, the clock signals involved are basically two, namely, the signal TCK and the signal DCK. It will moreover be appreciated that the diagram of FIG. 1 applies in general to any number n of clock signals, and therefore bears the reference nDCK.

The table below shows a possible arrangement.

| SIGNAL | USED FOR: |
|---|---|
| TDI | TAP + UDI |
| TDO | TAP + UDI |
| TCK | Only for TAP |
| NTRST | TAP + UDI |
| TMS | TAP + UDI |
| DCK | Only for UDI |

In particular, the table shows that the signals TDI, TDO, NTRST, and TMS (persons skilled in the sector are familiar with these acronyms and what they stand for, and hence no detailed explanation is here required) may be used for both of the TAP functions, i.e., both for the function of the chip ST20, designated simply as TAP, and for the homologous function of the chip SuperH40, generally designated as UDI.

The clock signal TCK is instead used only for the TAP function of the chip ST20 (reference number 40), whilst the signal DCK is used only for the UDI function of the chip SuperH40 (reference number 20).

The various signals TDI, TDO, NTRST, and TMS may then be shared, in particular as regards the signals that are to be forwarded, through lines designated as a whole by 55, to the individual debugging connections.

Figure 2:
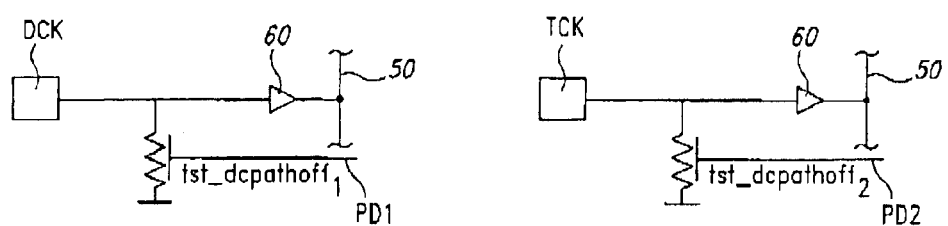
FIG. 2 illustrates, again in the form of a block diagram, certain constructional details of the system architecture of FIG. 1.

The need for selective application of the clock signal TCK or DCK is instead met by connecting the respective generator blocks (designated, as are the clock signals themselves, by DCK and TCK in the diagram of FIG. 2) to a common line 50 which distributes the clock signals to the various modules 20, 30, etc., associating to each clock a corresponding pull-down function.

The logic signals tst depathoff$_1$ and tst depathoff$_2$ present on lines PD1- and PD2, via a respective inverter 60, which also has the function of impedance seperator, so as to isolate or apply the corresponding clock on the line 50.

Thus if, for example, the TAP function 20 of the chip ST20 is to be used, the debug clock (DCK) is not used, which in fact assumes the value 0. The TAP function of the Hitachi chip (UDI) is stuck in the Test Logic Reset state since the transition of the state takes place on the rising edge of the clock.

The solution according to the invention does not require any change at the level of IP cells. Furthermore, no circuitry complexities arise at the pad level, and there are no appreciable differences between, for instance, pre-production specimens and full-production specimens.

From the diagram of FIG. 1, it will moreover be appreciated that, even in the case where a certain number of different chips is present, no pull-up or pull-down modules are required at a board level.

The solution according to the invention is compatible with low-cost emulation schemes, in particular with emulation schemes implemented through clock control with the use of a JTAG controller in a scanning environment.

Furthermore, the solution according to the invention is altogether compatible with internal clock generators, and hence generators on board the circuit, and it is moreover transparent in regard to the specific solutions adopted for the debugging function, possibly in combination with pipeline-type architectures.

Of course, without prejudice to the principle of the invention, the details of construction and the embodiments may vary widely with respect to what is described and illustrated herein. From the foregoing it will be appreciated that, although specific embodiments of the invention have been described herein for purposes of illustration, various modifications may be made without deviating from the spirit and scope of the invention. Accordingly, the invention is not limited except as by the appended claims and the equivalents thereof.

What is claimed is:

1. A process for management of a Test Access Port (TAP) function in a plurality of components arranged on a single chip, each of said components provided with a respective TAP function adapted to be driven by a respective dedicated clock and by at least one further signal, comprising the operations of:
   using said at least one further signal in a shared way between the TAP functions of the plurality of components;
   generating a clock signal for each component of the plurality of components using a dedicated clock generator for each clock signal; and
   selectively driving the TAP functions of the plurality of components with a respective dedicated clock.

2. The process of claim 1, comprising the operations of:
   associating, with said respective dedicated clock generator, a pull-down function.

3. The process of claim 2, comprising the operations of providing a common line for application of each clock signal to the TAP functions of the plurality of components.

4. The process of claim 2, comprising the operation of generating each clock signal on board said single chip.

5. A system for management of a Test Access Port (TAP) function in a plurality of components arranged on a single chip, each of the components provided with a respective TAP function adapted to be driven by a respective dedicated clock signal, comprising:
- at least one line for use of at least one further signal in a shared way between the TAP functions of the plurality of components; and
- a plurality of dedicated clock generators on the single chip, each clock generator generating a dedicated clock signal for selectively driving a respective TAP function in a respective component of the plurality of components.

6. The system of claim 5, comprising:
- at least one pull-down module associated with said respective dedicated clock generators.

7. The system of claim 6, comprising a common line for the application of each clock signal to the TAP functions of the plurality of components.

8. The system of claim 6, wherein said dedicated clock generators are arranged on the single chip.

9. A method of managing a Test Access Port (TAP) function in conjunction with a plurality of components on a single chip, comprising:
- providing each component of the plurality of components with a respective TAP function;
- providing each TAP function of the plurality of components with a dedicated clock signal generated by a dedicated clock generator on the single chip;
- providing at least one shared line for use by at least one further signal among the TAP functions of the plurality of components; and
- selectively driving the respective TAP functions of the plurality of components with a respective dedicated clock signal.

10. The method of claim 9, wherein providing each TAP function with a respective dedicated clock signal comprises generating respective dedicated clock signals for the TAP functions of each component of the plurality of components.

11. The method of claim 10, wherein providing each TAP function with a respective dedicated clock signal comprises associating with each respective dedicated clock signal a pull-down function.

12. The method of claim 11, wherein providing each TAP function with a respective dedicated clock signal comprises providing a common line for use by each of the respective dedicated clock signals.

13. The method of claim 12, wherein each respective dedicated clock signal is generated onboard the single chip by a dedicated clock signal generator.

14. A system for managing testing of a plurality of components arranged on a single chip, the system comprising:
- a Test Access Port (IAP) function associated with each component of the plurality of components on the single chip;
- a plurality of clock generators on the single chip, each clock generator associated with a respective TAP function for selectively driving the TAP function with a respective dedicated clock signal; and
- at least one shared line coupled to each component of the plurality of components and configured to carry at least one further signal.

15. The system of claim 14, further comprising at least one pull-down module associated with each respective clock generator and configured to generate a pull-down function.

16. The system of claim 15, further comprising a common line coupled to each of the respective clock generators and to each of the respective components of the plurality of components for selectively carrying each of the respective clock signals.

17. The system of claim 16, wherein each of the plurality of clock generators are provided on the signal chip.

18. A process for management of a Test Access Port (TAP) function in a plurality of components arranged on a single chip, each of said components provided with a respective TAP function adapted to be driven by a respective dedicated clock and by at least one further signal, comprising the operations of:
- using said at least one further signal in a shared way between the TAP functions of the plurality of components;
- generating a clock signal for each component of the plurality of components using a dedicated clock generator for each clock signal; and
- selectively driving the TAP functions of the plurality of components with a respective dedicated clock and associating, with said respective dedicated clock generator, a pull-down function.

19. A system for management of a Test Access Port (TAP) function in a plurality of components arranged on a single chip, each of the components provided with a respective TAP function adapted to be driven by a respective dedicated clock signal, comprising:
- at least one line for use of at least one further signal in a shared way between the TAP functions of the plurality of components;
- a plurality of dedicated clock generators on the single chip, each clock generator generating a dedicated clock signal for selectively driving a respective TAP function in a respective component of the plurality of components; and
- at least one pull-down module associated with said respective dedicated clock generators.

20. A method of managing a Test Access Port (TAP) function in conjunction with a plurality of components on a single chip, comprising:
- providing each component of the plurality of components with a respective TAP function;
- providing each TAP function of the plurality of components with a dedicated clock signal generated by a dedicated clock generator on the single chip, and associating with each respective dedicated clock signal a pull-down function;
- providing at least one shared line for use by at least one further signal among the TAP functions of the plurality of components; and
- selectively driving the respective TAP functions of the plurality of components with a respective dedicated clock signal.

21. A system for managing testing of a plurality of components arranged on a single chip, the system comprising:
- a Test Access Port (TAP) function associated with each component of the plurality of components on the single chip;
- a plurality of clock generators on the single chip, each clock generator associated with a respective TAP function for selectively driving the TAP function with a respective dedicated clock signal;

at least one shared line coupled to each component of the plurality of components and configured to carry at least one further signal; and at least one pull-down module associated with each respective clock generator and configured to generate a pull-down function.

* * * * *